ID="19"

United States Patent
Baldi

[11] Patent Number: 4,871,708
[45] Date of Patent: Oct. 3, 1989

[54] PYROPHORICALLY ACTIVATED IRON OR NICKEL FOIL AND METHOD OF TREATING SAME

[75] Inventor: Alfonso L. Baldi, Wynnewood, Pa.

[73] Assignee: Alloy Surfaces Company, Inc., Wilmington, Del.

[21] Appl. No.: 862,712

[22] Filed: May 13, 1986

Related U.S. Application Data

[63] Continuation-in-part of Ser. No. 830,767, Feb. 19, 1986, and a continuation-in-part of Ser. No. 757,606, Jul. 22, 1985, and a continuation-in-part of Ser. No. 605,248, Apr. 30, 1984, abandoned, and a continuation-in-part of Ser. No. 559,334, Dec. 8, 1983, and a continuation-in-part of Ser. No. 479,211, Mar. 28, 1983, Pat. No. 4,476,244, and a continuation-in-part of Ser. No. 281,405, Jul. 8, 1981, Pat. No. 4,708,913, and a continuation-in-part of Ser. No. 488,103, Apr. 25, 1983, Pat. No. 4,615,920.

[51] Int. Cl.$^4$ .............................................. B01J 25/00
[52] U.S. Cl. ..................................... 502/301; 428/680; 428/681
[58] Field of Search ................. 502/301; 428/680, 681

[56] References Cited

U.S. PATENT DOCUMENTS 3,489,694  1/1970  Weidlich et al. .................... 502/301

Primary Examiner—W. J. Shine

[57] ABSTRACT

Plain iron and nickel can be activated to become extremely pyrophoric and can have their pyrophoric action improved by short dip in acid solution having ph about 2 to about 4. Foils of such metals so treated can be folded to further increase pyrophoric action.

2 Claims, 3 Drawing Sheets

U.S. Patent    Oct. 3, 1989    Sheet 3 of 3    4,871,708
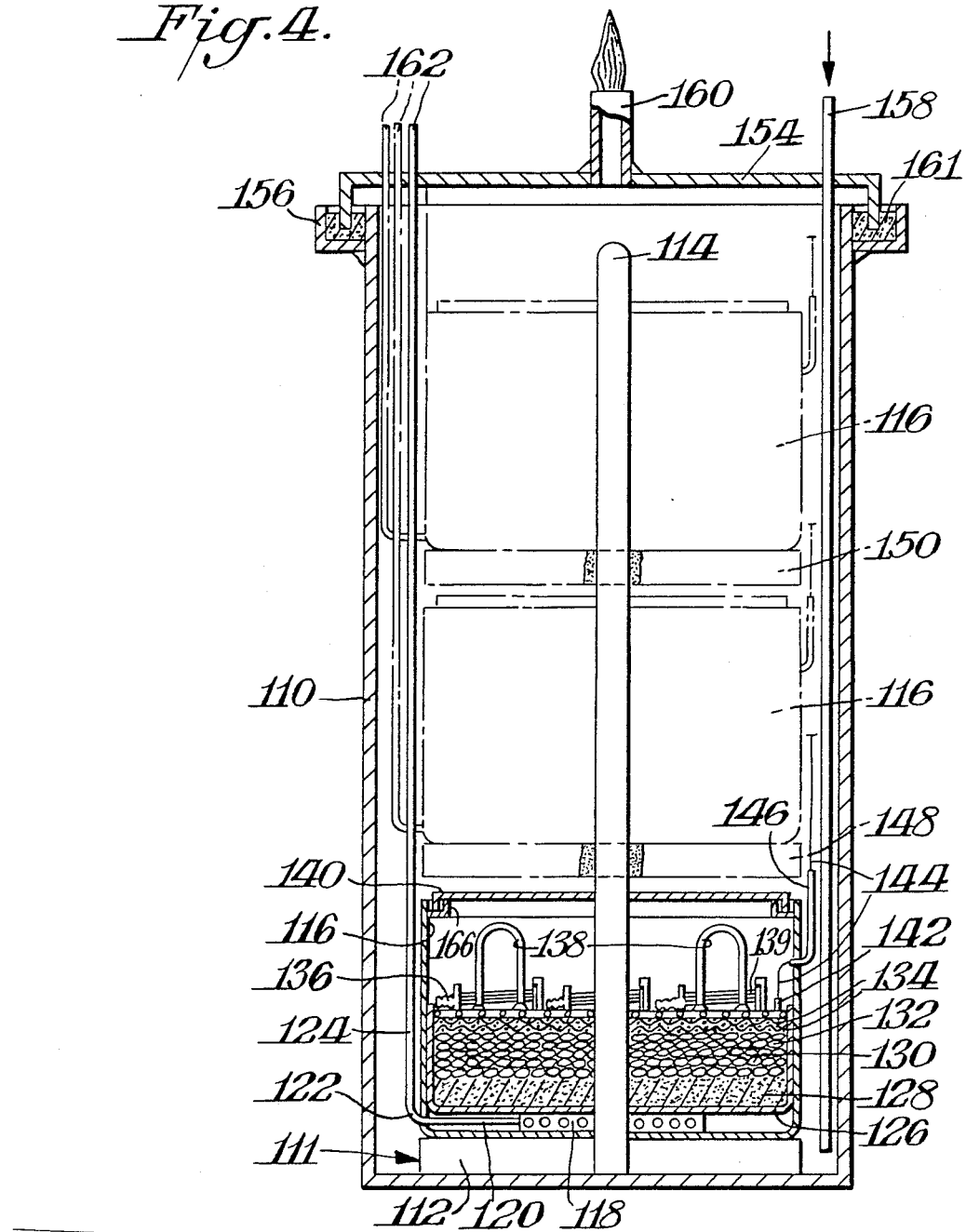
Fig. 4.
Fig. 5.

PYROPHORICALLY ACTIVATED IRON OR NICKEL FOIL AND METHOD OF TREATING SAME

This application is a continuation-in-part of applications:

| Serial No. | Filing Date |
|---|---|
| 830,767 | February 19, 1986 |
| 757,606 | July 22, 1985 |
| 605,248 | April 30, 1984 (abandoned) |
| 559,334 | December 8, 1983 |
| 479,211 | March 28, 1983 (U.S. Pat. No. 4,476,241) |
| | Patent 4,708,913 granted November 24,198 |
| 281,405 | July 8, 1981 |
| | (U.S. Pat. No. 4,615,920) |
| 488,103 | April 25, 1983 |

These parent applications are in turn direct or chained continuatiobs-in-part of the following earlier applications:

| Serial No. | Filing Date | Status |
|---|---|---|
| 359,212 | March 18, 1982 | U.S. Pat. No. 4,443,557 |
| 302,979 | September 17, 1981 | Abandoned |
| 242,350 | March 10, 1981 | U.S. Pat. No. 4,464,430 |
| 230,333 | February 2, 1981 | U.S. Pat. No. 4,347,267 |
| 172,671 | July 28, 1980 | U.S. Pat. No. 4,435,481 |
| 172,938 | July 28, 1980 | Abandoned |
| 98,654 | November 29, 1979 | U.S. Pat. No. 4,290,391 |
| 25,456 | March 30, 1979 | U.S. Pat. No. 4,439,612 |
| 963,313 | November 24, 1978 | Abandoned |
| 752,855 | December 21, 1976 | U.S. Pat. No. 4,208,453 |
| 694,951 | June 11, 1976 | Abandoned |
| 614,834 | September 19, 1975 | U.S. Pat. No. 4,141,760 |
| 579,945 | May 22, 1975 | Abandoned |
| 466,908 | May 3, 1974 | U.S. Pat. No. 3,958,047 |
| 446,473 | February 27, 1974 | U.S. Pat. No. 3,958,046 |
| 404,665 | October 9, 1973 | U.S. Pat. No. 3,948,689 |
| 357,616 | May 7, 1973 | U.S. Pat. No. 3,948,687 |

The present application is directed to diffusion-coated metals and to their uses, particularly for pyrophoric reactions.

Among the objects of the present invention is the provision of novel reactions for diffusion-coated metals.

The foregoing as well as other objects of the present invention will be more fully understood from the following description of several of its exemplifications, reference being made to the accompanying drawing.

Figure 1:
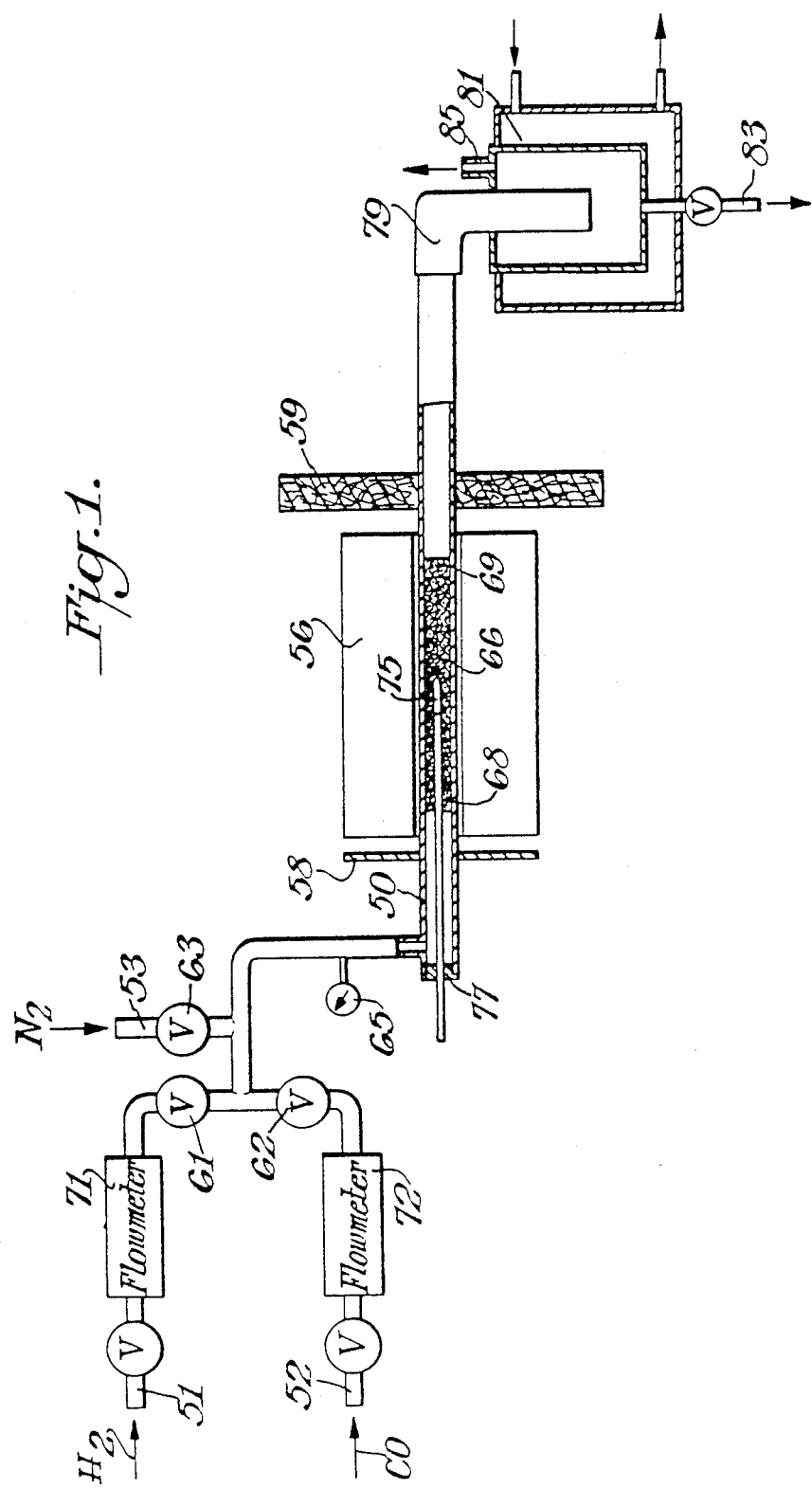
FIG. 1 is a diagrammatic representation of a methanol forming apparatus using a catalyst of the present invention.
Figure 2:
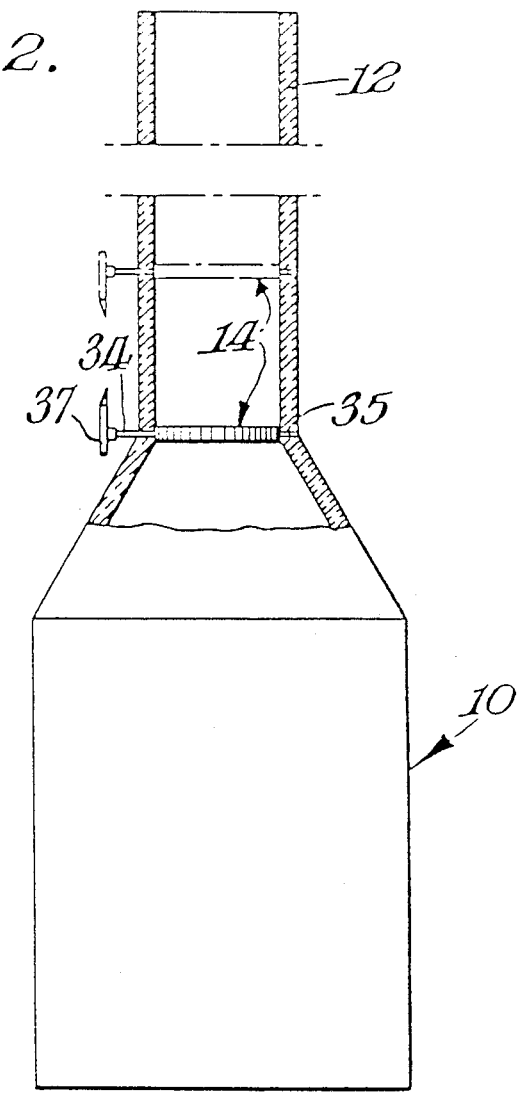
Figure 3:
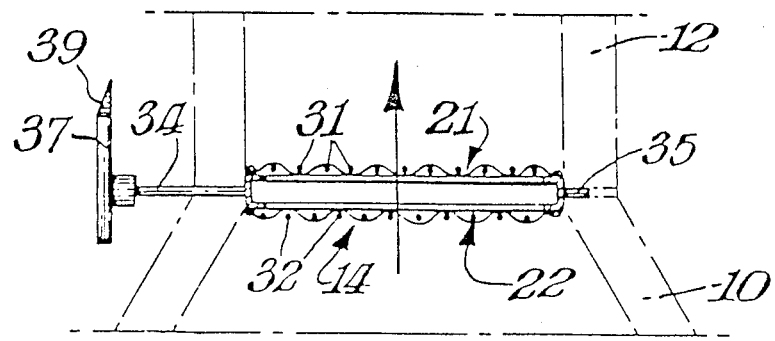

The drawing figures is an end view of a pyrophoric article pursuant to the present invention.

As noted in some of the parent applications, many metallic catalysts show improved catalytic activity when they are activated by the technique illustrated in the examples set out in U.S. Pat. No. 4,154,705. Such technique involves the low-temperature diffusion into the surface of the catalytic metal of a different metal which is subsequently leached out. The leachable metal is generally aluminum or zinc.

Pyrophoric action can be blocked for a few days by keeping the pyrophoric surface covered with leach solution or even plain water. Triethanolamine also protects such a surface if applied as a layer at least about 0.3 ml thick, and such protection can be maintained for long periods of time. Such a triethanolamine coating is also highly effective for protecting stored iron surfaces against corrosion caused by exposure to the atmosphere. Even chromized iron and chromized low alloy steels are very effectively protected against atmospheric corrosion by the triethanolamine coating.

To demonstrate such protection, chromized low alloy steel boiler tubing which withstands attack by high-temperature high-pressure steam for many years, will if stored unprotected outdoors or even in a shop atmosphere for a few weeks develop pit type corrosion that can become quite serious. Such corrosion as well as the corrosion of chromized or unchromized iron screens, is completely prevented by a triethanolamine coating.

The activation treatment of the present invention can be conducted with portions of the catalyst web masked so that no diffusion takes place at those portions. Thus the outer surface can be so masked using masking compositions analogous to those shown in the prior applications. Such compositions can also be applied in the form of pastes that do not flow and can be squeezed out of a syringe or collapsible tube like toothpaste. Thus into a solution of 9 grams of acrylate resin such as poly(ethylmethacrylate) in 100 cc methyl chloroform is stirred 2 grams of colloidal silica particles having a surface area of about 200 meters per gram. 100 grams of a mixture of finely divided brass and powdered alumina, in a 1:2 weight proportion is then stirred into the resulting thickened solution to form a paste that can be dispensed from a syringe fitted with a No. 13 needle having an internal bore about 60 mils in diameter.

The paste is dispensed directly onto the workpiece surface to be masked and remains in place. Accurate boundaries for a masked area of any contour are easily followed by such a technique. Moreover, the desired amount of masking mixture can be applied as a single layer of paste that can be as much as 60 mils thick, so that multiple dipping as described in Ser. No. 242,35, now U.S. Pat. No. 4,464,430, is not needed. Even thicker layers can be applied by using needles with larger bores, or by extruding the paste through a toothpaste tube. In general a paste thickness of at least about 10 mils is preferred.

Where two or more layers of different masking compositions are used one above another, as described in Ser. No. 242,350, now U.S. Pat. No. 4,464,430, corresponding layers of suitably formulated paste can be used. Thus the foregoing powdered masking layer can be covered by a layer of $Ni_3Al$ or nickel, with or without a refractory diluent such as alumina.

The extruded pastes lose much of their volatile solvent on standing a few minutes, and this evaporation changes the pastes to very hard layers that withstand the mechanical treatment needed to embed the masked workpieces in a diffusion coating pack. For this purpose at least about 95% of the liquid content of a paste should be volatilizable within about 5 minutes after the paste is extruded.

other thickening agents can be used, as well as other solvents and other resins, to make the pastes. To make an article of commerce the pastes are desirably formulated with the masking powder in one container, and the balance of the paste in another, so that the purchaser can mix them together fresh for use. A pre-mixed masking-powder-containing paste can be subject to settling over very long periods of time inasmuch as some of the powder is a metal of high specific gravity.

Diffusion coating packs in which the pack particles are very small, are particularly suited for diffusion coating the interiors of hollow articles. Some types of such interior coating are described in U.S. Pat. No. 3,936,539, and others in parent application Ser. No. 230,333, now U.S. Pat. No. 4,347,267. The entire contents of that parent application are hereby incorporated in the present specification as though fully set forth herein.

Of particular significance is the internal coating of hollow jet engine blades made of superalloys such as B-1900 or other nickel base superalloys, with the blades suspended in a retort having a layer of activated diffusion coating powder on the retort floor under the blades. Thus Example 4 of that parent application can be modified by not using the slurry for coating the interior of the blades there described, and instead vibrating into the cleaned and dried blade interiors a dry powder pack composed of, by weight 45% chromium powder the particles of which are less than 20 microns in size
10% aluminum powder minus 200 mesh
45% calcined alumina minus 200 mesh
to which mixture ½% fine $NH_4Cl$ powder is added. The resulting pack was pre-fired at 1950° F. for 10 hours, and then fresh $NH_4Cl$ was added and the pack sifted through a 60-mesh screen to make sure no coarse particles are present. The material not passing through the screen was discarded.

The blades with the sifted pack filling their interiors are then mounted in one of the retorts illustrated in Ser. No. 230,333, now U.S. Pat. No. 4,347,267 and the retort floor covered with a ¾ inch thick layer of a chromium-containing aluminizing pack such as one consisting of, by weight, 45% chromium powder, 15% aluminum powder, and 40% alumina powder, activated with ½% ammonium chloride or ammonium fluoride or biflouride, or a mixture of these. Alternatively the aluminizing pack on the floor and/or in the blade interior, can be a simple aluminizing pack such as one containing of a correspondingly activated mixture, by weight, of 10% aluminum powder and 90% alumina powder.

The retort is first heated, with a hydrogen flush, to 1900°–1950° F. where it is held for 9 hours, after which the heating is terminated and the retorts cooled. The interiors of the cooled blades are cleaned out by blasts of high pressure air, leaving blades with about a 3 mil internal aluminized case of very good uniformity, and an external case of practically the same or slightly lesser thickness. The external case tends to be a bit thinner at those portions of the blade remote from the retort floor, as compared to the blade portions close to the floor.

The foregoing simultaneous internal and external coating technique is particularly suitable for workpieces having interiors accessible only through a passageway less than about 5 millimeters, or even less than about 2 millimeters, wide. For passageways only about 0.1 millimeters wide, or narrower, the diffusion coating pack powder particles should be of extremely small size, as for example 10 to 20 microns. Using particles in the form of microspheres is also helpful, particularly in the smaller sizes, because such particles pour extremely readily. Other forms of pourable or fluent particles are also desirable.

Similarly effective diffusion coatings are formed with other superalloys, including cobalt-base superalloys, and even with other alloys and steels such as high-temperature steels. The layers on the retort floor can be any of those described in Ser. No. 230,333, now U.S. Pat. No. 4,347,267, and the packs loaded into the interiors of hollow blades or other hollow objects being coated, can also be selected from those that deposit the desired internal coating. Inasmuch as the objects being coated are not embedded in a pack, the labor involved is much reduced and heat-up and cool-down times also much reduced, as compared to the coatings described in U.S. Pat. No. 3,936,539.

A modified form of aluminum diffusion and leaching can also be used for applying coatings. In this modification there is first prepared an alloy of aluminium containing relatively small amounts of other metals to be coated onto a substrate. This pre-prepared alloy contains sufficient aluminum to bring its melting point down to 1800° F. or below, preferably 1400° F. or below. It can then be readily flame-sprayed on a workpiece, or the workpiece can be dip-coated in the molten alloy, and if desired the resulting coated workpiece heated in a protective atmosphere to improve the bonding. Where a protective atmosphere is used, it can be that of a diffusion coating activator like $NH_4Cl$ or $NH_4F$ or $NF_4HF_2$.

After the coating is completed, the coated workpiece is then dropped into a leaching bath that dissolves out most of the aluminum from the coating. Where some specific amount of aluminum is desired to be present in the coating after the leaching is completed, the leaching is terminated before the residual aluminum content drops too low.

After the completion of the leaching the workpiece has the desired coating, but the coating is in a microporous condition due to the voids introduced where the aluminum has been leached out. In such condition the coating is particularly receptive to receiving and anchoring top layers such as ceramic thermal barriers applied over jet engine vanes and blades.

A particularly desirable coating is the MCrAlY and McrAlZr type coatings described in U.S. Pat. No. 4,005,989 and in the U.S. Department of Energy report DOE/NASA/259-26 NASA TM-81685 dated February 1981. Although these coatings contain only about 12 to about 15% aluminum by weight, a good aluminum-rich starting alloy for dip-coating or flame-spraying contains about 40 to 50% aluminum with the remaining alloying ingredients in the desired final proportions. About 3 hours of leaching in 20% aqueous NaOH at 140° F. subsequently removes essentially all the excess aluminum. The MCrAlY type coatings should not be leached too vigorously because the yttrium tends to be leached out by strong hot caustic.

After the leaching the leached products are rinsed and then top-coated with a mixture of extremely fine particles of $ZrO_2$ and $Y_2O_3$ as described in the above-cited Department of Energy report and the reference cited therein. Such top-coatings generally have the $ZrO_2$ and $Y_2O_3$ in a molar ratio of from about 1:8 to about 1:12. Such mixtures can be slurried in water and the leached workpiece dipped in the slurry. The workpiece is now fired at about 2000° F. for a few minutes to secure the oxides in place, and the dipping and firing repeated to form an effective thermal barrier that can be about 5 to about 15 mils thick.

The "M" of the MCrAlY and MCrAlZr can be nickel, cobalt, iron or mixtures of any two or all three of these metals.

A thermal barrier is not needed when the diffusion coating is used for NOX removal and contains vanadium or other NOX-removing catalysts.

Other thermal barriers or top coatings can be substituted for or added to the $ZrO_2$ and $Y_2O_3$ mixtures, although ceramic barriers are preferred. Typical top coatings are shown in U.S. Pat. No. 4,260,654.

Any of these top coatings and thermal barriers can be applied over other porous undercoatings such as the porous nickel and platinum coatings described in U.S. Pat. No. 4,154,705. The nickel and platinum can themselves be applied as an alloy with aluminum or other selectively removable metal, and the selectively removable metal then removed as by leaching.

Alternatively a superalloy jet engine blade can be flame-sprayed with an aluminum-rich Al-Pt alloy, after which excess aluminum is leached out and the final porous surface heat-treated at a temperature high enough, e.g. 2000° F., in a diffusion atmosphere to cause the surface metal to diffuse into and thus fill the pores.

A further modification is the low-temperature diffusion of an aluminum coating into the surface of a substrate such as a superalloy jet engine blade, followed by leaching to render the aluminized surface porous, after which a solution of a thermally decomposable compound of a desired metal like platinum is absorbed into that porous surface and dried. The resulting material is now subjected to a diffusion treatment with or without an aluminizing pack, to liberate the platinum or other free metal, fill the pores, and blend the surface metals.

Cobalt also provides a suitable porous undercoat when applied and then rendered porous. While iron is quite similar in its characteristics, the leaching of iron-aluminum undercoating should be quite limited inasmuch as heavy leaching leaves the porous iron residue poorly adherent to the substrate. Platinum, nickel and cobalt give very good results when their porous stratum is from about ½ to about 2 to 3 mils thick, but porous iron provided in this way should not be over 1 to 2 mils thick. The aluminum alloy thickness on which the porous strata are formed should be about one or two mils thicker than the final porous layer.

The porous nickel, iron, platinum, cobalt and silver surfaces described in U.S. Pat. No. 3,637,437 can also be used to better anchor top coatings, whether applied to the substrates disclosed in that patent or on other metallic or non-metallic substrates.

The foregoing leaching can leave a product with a pyrophoric porous stratum that spontaneously reacts with oxygen in the air. The nickel, cobalt and iron is covered by an oxide film as a result of such reaction, but this oxide film does not completely block the pores over which it forms and does not interfere with the application of top coatings. Where the substrates carrying the undercoatings are extremely thin themselves, the reaction with oxygen can cause a substantial temperature rise, particularly in the case of porous nickel.

The foregoing porous undercoatings of platinum, nickel, cobalt, iron, and even silver can also be used to better anchor an MCrAlY or MCralZr top coating which can then be applied by the standard plasma coating technique, and if desired can also be further protected by an overlying thermal barrier layer.

As described in the parent applications, the pyrophoric action of pyrophoric members can be increased by placing in intimate contact with the member, a solid or liquid that undergoes an exothermic reaction when heated. Metals like magnesium and titanium, and even boron can thus be adhered to a pyrophoric foil as by placing a magnesium ribbon over an activated foil and passing the assembly between a pair of pressure rollers. Powdered materials such as magnesium, titanium, manganese, zirconium, carbon, aluminum or boron can be dispersed in a volatile liquid and the dispersion applied to an activated member and dried. Commercially available boron powder is very effective when dispersed in an alcohol such as ethanol.

Such pyrophoric combinations need not be in the form of very thin coated foils, and can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by activating the surface of an iron foil or sheet and scraping off the activated layer. Raney iron can also be used. Activated nickel powder can be prepared the same way but the scraping is much more difficult and it is accordingly preferred to use Raney nickel powder or to leach powdered $NiAl_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particle size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅛ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The leaching after compacting and sintering to make pyrophoric masses, is particularly desirable for the making of masses such as discs or ribbons whose pyrophoric action is desired to have a long duration. This is illustrated in Example 1.

EXAMPLE 1

A mixture of carbonyl iron powder with an equal weight of fine aluminum powder is pressed together and sintered as described in U.S. Pat. No. 3,379,635 to form a disc about 50 mils thick. The disc is then leached with hot 30% NaOH solution overnight to yield a pyrophoric porous article which when exposed to air generates heat for about two minutes.

The maximum temperature developed at the disc's surface is only about 400° F., but this temperature can be increased by impregnating the porous disc with material that is rendered exothermic by the pyrophoricity. Thus an aqueous suspension of micron-sized powdered zirconium can be poured on the porous disc to cause the fine zirconium particles to lodge within the disc's pores. On drying the pyrophoric heat generation ignites the zirconium so that the maximum temperature of the disc's surface goes well above 400° F.

Powdered boron is a very effective heat generator but ignites at a temperature higher than zirconium does. Impregnating the foregoing porous disc with a mixture of 5 weight % zirconium and 5 weight % boron, based on the weight of the unimpregnated disc, yields a very effective pyrophoric combination however, in which both the zirconium and the boron burn upon exposing the impregnated disc to air.

The non-pyrophoric coating ignited by a pyrophoric substrate can be of the type that exothermally reacts in the absence of atmospheric oxygen. Thus the coating can be picric acid or a thermite mixture of finely divided aluminum and iron oxide powders, or ammonium dichromate, or gunpowder or a mixture of finely divided iron or boron with sodium nitrate or chlorate. Such a coating only about 1 to 2 mils thick on a pyrophorically activated iron or nickel foil about 2 mils thick, is ignited by the pyrophoric action when the coated foil is discharged into the thin air at altitudes of about 30,000 to 50,000 feet, and then generates supplemental heat more effectively than the pyrophoric action at those altitudes.

A little resin binder may be used to help hold such exothermic coatings in place, although soluble materials can be adherently deposited from solution in a vaporizable solvent such as methanol or water, and the solvent then vaporized off.

The foregoing exothermic coatings that react in the absence of atmospheric oxygen, can also be effectively applied to the above-discussed discs.

The sintered products can have their pyrophoricity blocked by the same coatings or atmospheres used to preserve pyrophoric foils. Moreover by combining two different types of coatings, enhanced blocking effects are obtainable. Thus dipping an activated iron or nickel foil in a 30% aqueous dispersion of colloidal silica, followed by removal and drying of the dipped foil, leaves a foil surface that more slowly generates pyrophoric heat. The heat dwell is made a few seconds longer and the peak temperature reached can be almost 100° F. lower. However when 10 to 90% of the silica in the dispersion is replaced by the triethanolamine chelate of dipropoxy titanium, the phyrophoricity-blocking effect is much more pronounced. The heat dwell can then be extended about 40% while the peak temperature drops a little over 200° F. A mixture of about 2 parts silica and about 3 parts chelate, is preferred.

The foregoing chelate has the formula

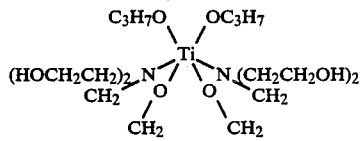

Triethanolamine, diethanolamne or monoethanolamine can be mixed with the colloidal silica to give effects similar to those of the chelate, and colloidal alumina can be correspondingly substituted for the colloidal silica, as can colloidally-sized, i.e. submicron-sized, particles of other inert solids.

A feature of the construction of Example 1 is that the phyrophoric product made, whether or not impregnated, is very inexpensive to prepare. The total cost of the ingredients is quite small, and the compacting and sintering steps are not expensive. No diffusion coating is needed and the sintering can be completed in as little as 30 minutes. An inert or reducing atmosphere is preferably used for the sintering.

Nickel powder can be substituted for the iron powder in the compacts, but is preferably mixed with 1½ times its weight of aluminum powder. A 50-mil thick disc press-sintered from such a mixture and then leached 14 hours with hot 20% aqueous NaOH is more pyrophoric than the leached iron-aluminum disc of Example 4, but its pyrophoricity does not last as long. Such a leached nickel-aluminum disc can have its pores impregnated with inert particles such as the alumina and silica mentioned supra, to stretch out its pyrophoric heat output. On the other hand it can be impregnated with heat-generating materials to further accentuate its high heat output. It will for example ignite micron-sized boron particles without the need for the low-ignition-temperature zirconium.

The press-sintered masses can be made thicker or thinner than 50 mils. Making them 10 mils thick for example, makes them sufficiently light in weight so that they will fall through the air relatively slowly, particularly if the discs are 1½ inches or more in diameter. A group of such discs can then be discharged in the air to act as an effective decoy for heat-seeking missiles. Their effectiveness as a radar decoy is improved if the discs are given a plating of copper or silver on one or both faces. Not more than 0.1 mil of such plating is needed. Electroplating is preferred over electroless plating.

The pyrophorically-active discs also have good catalytic properties. For catalytic use it is generally safer to first eliminate the pyrophoricity, as by treatment with H₂O₂ and water as described in Ser. No. 359,212 now U.S. Pat. No. 4,443,557. An active platinum disc made by the press-sintering technique is also a very good catalyst after leaching, but eliminating its pyrophoricity is best effected by contacting it with dilute hydrochloric acid or other mineral acid. Catalytic platinum prepared this way has the added advantage that its content of contaminants such as carbon or iron can be kept extremely low. When preparing such catalytic platinum with an aluminum-diffusion step, the diffusion retort used to contain the diffusion materials tends to diffuse some of its constituents into the platinum. Carbon is thus frequently found in platinum that has been given a diffusion treatment in a steel retort. The use of a diffusion-coating retort made of nickel containing less than 0.1% carbon, does prevent such carbon contamination.

Diffusion coating has the advantage of being readily confined by masking, to specific areas of a substrate. This is illustrated in detail in the patent applications such as Ser. No. 242,350, now U.S. Pat. No. 4,464,430, and can be effected with the diffusion coating of platinum on superalloy airfoils of jet engines. Thus as shown in U.S. Pat. No. 4,041,196, platinum plating on the airfoil surface of nickel-base superalloy blades for the hot section of a jet engine, improves the life of the blades, particularly when the platinum plated airfoils are then given a diffusion aluminizing or chromaluminizing. The above-noted MCrAlY and MCrAlZr coatings also greatly improve such life. By masking the roots of the blades, these coatings can be kept from the roots, where they are not needed and where they can increase dimensions out of tolerance.

Some blaades however are made of hafnium-containing superalloy, for example Rene 80, and do not accept aluminum or MCrAlY or MCrAlZr coatings well unless the surface being aluminized is treated to deplete its hafnium content. To this end the blades can be given a heat treatment with their airfoil surfaces packed in a mixture of powdered nickel and inert refractory diluent like alumina. Only about 10% nickel by weight in such a pack will be enought to adequately deplet the airfoil surface at 1200° F. for about one hour in a diffusion coating atmosphere such as one provided by the decomposition of NH₄Cl or other diffusion coating energizer.

The foregoing depletion can be quite pervasive, and is undesirable if it extends to the blade root where maximum strength is needed. The root is accordingly packed in a separate masking mixture such as the high-chromium masking powders of parent U.S. Pat. No. 3,801,357. A typical formulation for this purpose is a mixture of powdered Ni₃Al with powdered chromium and powdered inert refractory diluent, in which the chromium content is about 3 to about 10 weight %, and the diluent content is about ¼ to about ⅝ by weight. The Ni₃Al can be replaced by nickel aluminides having more than one-third and up to three-fourths atom of aluminum for every atom of nickel. The chromium content should be not over 15%, and the nickel aluminides can be omitted.

The temperatures at which such masking is effective are the same temperatures at which the airfoil depletion is effected, and can vary from about 1000° F. to about 2000° F. Inasmuch as very little depletion is needed, the depletion treatment is preferably kept short—not longer than about 2 hours at the masking temperature. Even ½ hour of depletion treatment improves subsequent coatings iɔcluding aluminizing whether of the complex kind that uses a pack containing both chromium and aluminum powders or the simple pack treatment in which there is no significant amount of chromiumm in the pack, or whether the aluminizing is conducted in the gas phase as described in U.S. Pat. No. 4,347,267. Apparatus suitable for the masking of the present invention is shown in U.S. Pat. No. 3,801,317.

The Rene 80 alloy is a nickel-base superalloy, and cobalt-base superalloys can also contain hafnium and require surface depletion. The depletion treatment for cobalt-base superalloys can be exactly the same as for nickel-based alloys, including the use of the above-noted root-masking technique. However for the cobalt-base superalloys, cobalt aluminides can also be substituted for the corresponding nickel aluminides in the root-masking compositions. The root-masking compositions can also contain a very small amount of hafnium—about ¼ to ½% by weight—to improve their masking effects.

MCrAlY and MCrAlZr coatings are generally applied by holding the workpieces in an evacuated chamber into which the coating ingredients are plasma sprayed. It is accordingly helpful to have the workpieces pre-masked as by embedding the portion to be maskᴜd—the root of a jet engine blade for example—in a masking powder, or by applying to that portion an adherent masking mixture. A very effective masking for this purpose is made of two superposed coating layers, the lower layer being a nickel aluminide layer as described in U.S. Pat. No. 3,801,357, and the upper layer being a thin coat of powdered nickel with or without a little powdered aluminum. The aluminide of the lower layer has less than one atom of aluminum for each atom of nickel, and can also contain a little chromium as described in U.S. Pat. No. 3,801,357. The aluminum powder in the upper layer should provide not more than one atom of aluminum for every three atoms of nickel in the upper layer.

The lower layer preferably has a thickness of about two to 10 mils, and the upper layer about 3 to 8 mils. In such a masking combination the lower layer prevents depletion from the workpiece portion it covers, and the upper layer forms an adherent protective sheath as the plasma spray operation starts, thus anchoring both layers in place during the entire MCrAlY or MCrAlZr coating sequence. A little inert refractory powder such as alumina or mixed iron-zirconium-silicon oxides, can be mixed with the nickel powder of the upper layer, preferably not over 10% by weight of nickel.

The heat generation from a pyrotechnic article is ᴄenerally of relatively short duration. Thus, an iron foil 0.05 millimeter thick, after pyrophoric activation on both faces and cutting to a square 4.5 centimeters on edge, will on exposure to air with both the foil and air at room temperature, rapidly get hot enough to reach about 1280° F. and then cool down to about 350° F. to about twelve seconds.

The time dwell can be increased over 60% by bending the foil so portions interfere with the open radiation of other portions. By way of example when the above-activated foil, before exposure to air, is run through a corrugator which forms seven equally spaced corrugations each about 4 millimeters deep and then exposed and its radiation output measured the same way as the flat foil was measured, shows a maximum temperature of about 1310° F., and takes about 29 seconds to cool down to 350° F. FIG. 5 illustrates such a corrugated web. About 2 to about 4 corrugations per centimeter, each about 3 to about 6 millimeters deep, are preferred.

A similar or even greater increase in dwell is obtained by accordion-folding the activated flat foil to provide three equal-width folds joined by sharp creases in the foil. The dwell is greater when the folds are folded together to form a generally flattened accordion, as compared to pulling the accordion folds apart so the resulting foil is very much like a corrugated foil. The natural springiness of the foil can cause the folds to open a little after the folds are made.

The increase in high temperature dwell can be as much as about 200%, and is very helpful when the activated foil is used as a decoy for heat-seeking missiles. For such use it is desirable to have a dwell of at least about 15 seconds and preferably at least about 30 seconds. Dwells of that magnitude and more are readily obtained from a relatively tightly folded 4-fold accordion folded foil, or from a foil currugated to a depth of at least six millimeters with at least four corrugations per centimeter.

A feature of the corrugated and accordion-folded foils is that they nest very effectively so a large number of them can be packed into a small container such as a decoy shell that ruptures and ejects a cloud of decoy foils. The accordion foil embodiments nest with maximum packing density when they are folded flat, but they can alternatively be nested when pulled out so the nesting is like that of the corrugated embodiments. When nested flat, the accordion folds are preferably made with some springiness as noted above, so they will open a little when a nested pack is ejected into the air. Such springiness is readily provided by making the folds with minimum folding force.

Iron foils are very inexpensive starting materials from which to make the decoys, and they can be activated on one or both of their surfaces. The degree of activation is such that the foil thickness after activation is about 2 to 3 times its thickness before activation. When starting with an unactivated foil about 1½ to about 3 mils thick, the activated and corrugated or accordion-folded foil will, when ejected in masses of about 1000 or more each about 2 to about 5 centimeters long and about 1 to about 3 centimeters wide, fall through the air in a trajectory that is very effective for decoy use. Such trajectory is steeper at altitudes of 8 kilometers than at sea level, but is suitable at both altitudes as well as at intervening altitudes.

Instead of iron foils other types of pyrophoric or pyrotechnic webs can be used. Nickel foil works about the same way as iron foils but generally shows a somewhat steeper temperature rise and shorter heat-generating dwell along with a higher temperature peak. Woven carbon fiber cloth as a lower density than metal and for use as a missile decoy is preferably about ¼ to about ¾ millimeters thick. Such cloths can be impregnated with pyrophoric powder in sufficient quantity so that when the impregnated cloth is exposed to the air, the pyrophoric powder ignites spontaneously and then ignites the cloth.

Alternatively, the carbon fiber cloth can be ignited with a pyrophoric liquid aluminum alkyl, as for example, by packing a quantity of the cloths inside a discharging shell along with tri-ethyl aluminum.

As shown in the parent applications, the carbon cloth is made easier to ignite as by etching its surface and/or coating the surface with lead or copper acetate deposited from aqueous solution. However, it can be ignited even when not pre-treated.

The carbon cloths can be folded in the manner described above for the metal foil to increase the dwell of their heat output. To obtain the folds in the carbon cloth, the cloth can be impregnated with a stiffening resin, like polyethylene terephthalate or polyvinylacetate or polymethylmethylacrylate. Alternatively, the carbon fiber can be woven with stiff metal wires or can be woven through a stiff metal screen.

The radiation effectiveness of any of the pyrotechnic webs for decoy use can be substantially improved by adherently coating their surfaces with a layer about 20 to about 500 microns thick of finely divided alumina, silica or zirconia, or mixtures of any two or all three in any proportions. Thus, a 0.4 millimeter-thick web of woven carbon fiber cloth pre-treated with 0.2 molar lead acetate and impregnated with 1% to 10% activated iron powder, is immersed into a 2.5% by weight solution of poly (ethyl acrylate) resin in methylethylketone, then the impregnated cloth is withdrawn from the resin solution, dried for a few seconds and dropped into a container having a quantity of 325-mesh zirconia. The container is shaken in order to get the zirconia particles spread over the cloth, after which the coated cloth is removed and dried. When the dried product is exposed to air, the particles of activated iron ignite and ignite the carbon which then burns and the incandescence thus produced has a high concentration of radiation in the 8-to-14-micron wave length of the spectrum. A somewhat better concentration is obtained when half the zirconia is replaced by alumina.

Silica and/or silicon carbide particles can be used in place of or in mixtures with the zirconia and/or alumina.

The particles can be applied to the carbon cloth web by spraying on it a slurry of the particles in the resin solution. It is preferred that the slurry contain a high concentration of the particles, about 10 to 50 times the weight of the resin.

A preferred technique is to take a flat carbon fiber cloth about 0.5 millimeter thick and pre-dipped as noted above in aqueous lead acetate and then dried, coat one of its faces with a spray of 90 parts by weight of a 1:1 mixture of 325-mexh $ZrO_2$ and $Al_2O_3$ slurried in 100 parts by weight of a 2 weight percent solution of poly (methylmethacrylate) in acetone. The coating is built up to a thickness of about ¼ millimeter, and then permitted to dry. On the opposite face of the cloth there is sprayed on, in an argon atmosphere, about a 70 micron-thick slurry of activated iron powder particles about 10 microns in size, in twice its weight of a 3 weight percent solution of poly (ethyl acrylate) in acetone. This coating can be as much as 300 microns in thickness.

The second coating is dried in the argon atmosphere and still in that atmosphere is given a top coating of the $ZrO_2$-$Al_2O_3$-binder slurry, about ⅓ the thickness of the original $ZrO_2$-$Al_2O_3$-binder coating, and again the coated cloth is dried in the argon atmosphere. One or more of such coated cloths can be sealed in a plastic bag or decoy shell and will keep until needed for decoy use. At this time, the cloths are exposed to air and will spontaneously ignite. They show a very good thermal radiation in the 8-to-14 micron band. The face carrying the thicker $ZrO_2$-$Al_2O_3$-binder coat shows stronger radiation in that band than the face carrying the thiner such coat.

Solution of other tacky resins such as other acrylic resins, polyvinylacetate, polyurethanes and pressure-sensitive resin formulations can be used in place of the noted poly acrylates. Suspensions of resins in liquids in which they do not dissolve are not particularly effective.

Where an aluminum alkyl is used for ignition in place of the activated iron, the adhesive resin should not be one in which the alkyl dissolves.

Activated iron or nickel particles, when used, can be applied to the carbon cloth by the techniques described for the zirconia, or the resin-to-activated-powder ratio can be diminished and even reduced to zero. Thus, a resin-free slurry of very finely divided activated powder in water can be sprayed onto one or both faces of the carbon cloth to deposit about 1/50 to about 1/10 gram of the activated powder per square centimeter of cloth surface. After a little drying in argon, there is then sprayed over both faces of the particle-carrying cloth, a slurry of zirconia powder. This binder in the zirconia slurry then holds the activated powder particles in place, and such a coating not over about 100 microns thick does not prevent their pyrophoric reaction when the coated cloth is exposed to air.

The pyrophoric metal foils of the present invention are preferablly prepared in large quantities by the use of the open-coil activating technique described in U.S. Pat. No. 4,443,557. A number of individual activating retorts can thus be loaded with an open coil of iron foil, and with the mixture of 20% powdered aluminum and 80% powdered alumina, along with about ½% to about 1% of $AlCl_3$ or $CrCl_3$ activator. The individual retorts so loaded are moved through a furnace as described in connection with FIG. 4 of U.S. Pat. No. 3,903,338, so the contents of each retort reach about 1200° F. for about ½ to about 1 hour. Better results are obtained at lower temperatures and longer times, as for example, 900° F. for 16 hours.

After cooling, the aluminized foil is reacted with aqueous caustic containing dissolved tin as described in the parent applications to latch out some of the aluminum which had diffused into the foil.

Alternatively, the foil can be activated by continuous reeling of a long length through a retort as shown in U.S. Pat. No. 4,435,481. As there described, the activation can be effected on one or both faces of the foil. The mixture of powdered alumium and powdered alumina should have at least 40% alumina by weight, inasmuch as smaller proportions of alumina will permit some of the powdered aluminum, which melts during the treatment, to wet the foil. This is undesirable inasmuch as it blocks the activated diffusion of the aluminum into the iron. Such activated diffusion brings much more desirable results than diffusion from a melt coating.

The Raney activated iron and nickel or alloys of these two are well as cobalt can have their heat generation and high-temperature dwell increased by subjecting them to a very short treatment in dilute acid. An aqueous or non-aqueous solution of inorganic or organic acid having a pH of about 1 to about 4, preferably about 1.5 to 3.5 is effective, and stronger acidities are not as effective. The dip need only be about ¼ minute long after gasing starts, but longer dips do not significantly detract from the effects unless the acid used is a strong mineral acid.

A 5-minute dip in 1% to 10% citric acid in water of freshly activated 4-mil thick iron foil, the leaching of which was effected in the presence of tin, increases its maximum phyrophoric temperature by about 50° F., and increases the dwell at or about 1200° F. from about one second to about three seconds. The dwell at or about 1150° F. is increased from about 1.6 seconds to about 4.5 seconds, and the dwell at or about 1100° F. from about 3 seconds to about 5 seconds.

A corresponding dip in 1% to 10% aqueous succinic acid produces about the same results, and similar acetic acid treatment effects only slightly smaller increases. Hydrochloric acid at 7% concentration in water is not quote as effective as 10% aqueous acetic acid. Other acids that can be used are chloroacetic acid, formic acid, lactic acid, maleic acid, mallonic acid, p-nitro benzoic acid, phosphoric acid, picric acid, salicylic acid, sulfuric acid and tartaric acid. Any acid capable of supplying a pH of between 1.5 and 4 is appropriate. However, acids like nitric acid attack the substrate very rapidly and contact with such acids should be held down to about ¼ minute.

The acids can be dissolved in lower monohydric alcohols such as methanol, thanol or isopropanol or in mixtures of such an alchol with water, and still provide the increase in maximum pyrophoric temperature and high temperature dwell. Organic acids are preferred, particularly the polycarboxylic acids.

The dips can be effected at any temperature from about 20° F. to about 210° F., but ordinary room temperatures of about 60° F. to 90° F. are easiest to use. Pyrophorically activated nickel foil also shows corresponding improvements in maximum pyrophoric temperature and high-temperature dwell, as do activated iron and nickel screens. Such improvements of activated iron is obtained whether or not tin is used during its leaching.

Combining the acid dip with the folding of the drawing figure provides still greater increases in dwell.

Such increases are particularly desirable in the use of the activated materials as decoys for heat-seeking missiles. For such use, the Raney-activated and acid-treated metal is preferably a foil between about 2 and about 6 mils thick. The folding increases the foregoing high-temperature dwells at least an additional 60%.

The activated metal foils can also be coated with a binder-containing slurry of the $ZrO_2$, $Al_2O_3$ or other material that concentrates pyrophoric radiation in the 8-to-14 micron range. Again, the slurry should contain solid particles in an amount from about 10 to about 50 times the weight of the binder, and the coating should not be over about 100 microns thick on at least one face of the foil.

Many modifications and variations of the present invention are possible in the light of the above teachings. It is, therefore, to be understood that within the scope of the appended claims the invention may be practiced otherwise than as specifically described.

I claim:

1. The method of treating a pyrophorically activated Raney iron or nickel foil about 2 to about 6 mils thick, which method is characterized by contacting the activated metal with a solution of an acid, which solution has a pH between about 1 and about 4, to cause gas generation, maintaining the contact at least about ½ minute after gas generation begins to thereby increase the maximum pyrophoric temperature and the high temperature dwell of the metal, and the foil is folded to further increase the high temperature dwell at least a further 60%.

2. A pyrophorically activated iron or nickel foil about 2 to about 6 mils thick, the foil being folded so that upon exposure to air it undergoes a pyrophoric heat generation which keeps it hot at least 60% longer than the unfolded foil.

* * * * *